United States Patent
Tamura

(10) Patent No.: US 6,410,860 B2
(45) Date of Patent: *Jun. 25, 2002

(54) ELECTRONIC CIRCUIT PACKAGE ASSEMBLY WITH SOLDER INTERCONNECTION SHEET

(75) Inventor: Koetsu Tamura, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/897,428

(22) Filed: Jul. 21, 1997

(30) Foreign Application Priority Data

Jul. 22, 1996  (JP) ............................. 6-191290

(51) Int. Cl.$^7$ ................................. H05K 1/16
(52) U.S. Cl. ................. 174/260; 174/263; 439/66
(58) Field of Search ................ 174/260, 263, 174/264, 262; 361/760, 767, 770, 783, 768; 439/66, 91

(56) References Cited

U.S. PATENT DOCUMENTS

| | | | | |
|---|---|---|---|---|
| 4,902,857 A | * | 2/1990 | Cranston et al. ........... | 174/94 R |
| 5,041,183 A | * | 8/1991 | Nakamura et al. .......... | 156/264 |
| 5,174,766 A | * | 12/1992 | Yoshizawa et al. .......... | 439/91 |
| 5,203,075 A | | 4/1993 | Angulas et al. ............... | 29/830 |
| 5,477,933 A | * | 12/1995 | Nguyen ....................... | 174/262 |
| 5,509,203 A | * | 4/1996 | Yamashita ................... | 29/879 |
| 5,530,288 A | * | 6/1996 | Stone .......................... | 257/700 |
| 5,576,519 A | * | 11/1996 | Swamy ........................ | 174/265 |
| 5,691,041 A | * | 11/1997 | Frankeny et al. ............ | 428/209 |
| 5,770,476 A | * | 6/1998 | Stone .......................... | 438/106 |
| 5,870,289 A | * | 2/1999 | Tokuda et al. .............. | 361/779 |
| 5,896,276 A | * | 4/1999 | Tamura et al. .............. | 361/767 |
| 6,080,936 A | * | 6/2000 | Yamasaki et al. ........... | 174/263 |

FOREIGN PATENT DOCUMENTS

| | | |
|---|---|---|
| JP | 8-153750 | 6/1996 |
| JP | 8-153751 | 6/1996 |
| JP | 8-162498 | 6/1996 |

OTHER PUBLICATIONS

"Basic Course for Electronics Mounting Technologies", edited by Society for Hybrid Microelectronics (Japan), published by Industrial Research (Japan), vol. 1, pp. 260–267.

* cited by examiner

Primary Examiner—Kamand Cuneo
(74) Attorney, Agent, or Firm—Sughrue Mion, PLLC

(57) ABSTRACT

An electronic circuit package assembly of the present invention and implemented by a TAB (Tape Automated Bonding) system includes a sheet formed of thermosetting resin. The sheet intervenes between a substrate and an organic insulating film carrying an LSI (Large Scale Integrated circuit) chip thereon. Solder is buried in the sheet beforehand. The assembly is heated to cause the solder to melt and connect wiring electrodes formed on the substrate and outer leads provided on the organic insulating film. The assembly has high reliability when compared with other connection methods using solder and effectively prevents migration of the tape carrier.

8 Claims, 2 Drawing Sheets

ELECTRONIC CIRCUIT PACKAGE ASSEMBLY WITH SOLDER INTERCONNECTION SHEET

BACKGROUND OF THE INVENTION

The present invention relates to an electronic circuit package assembly with an electronic part mounted thereon, and a method of producing the same.

One of conventional TAB (Tape Automated Bonding) technologies for electronic circuit package assemblies is disclosed in a reference entitled "Basic Course for Electronics Mounting Technologies", edited by Society for Hybrid Microelectronics (Japan) and published by Industrial Research (Japan), Vol. 1.

Among various bare chip mounting systems, a TAB system is ranked with a wire bonding system and a flip chip bonding system. Basically, the TAB system consists of ILB (Inner Lead Bonding) and OLB (Outer Lead Bonding). ILB connects the electrodes of an LSI (Large Scale Integrated circuit) chip and a carrier tape via bumps. OLB connects the LSI chip having leads stamped out from the carrier tape to a substrate. Such a basic process is taught on page 261 of the above-mentioned reference. Specifically, by the OLB, the LSI chip with the leads, i.e., a TCP (Tape Carrier Package) is stamped out (with or without the tape) and then connected to a circuit board, as taught on 265 of the same reference.

In the above configuration using the TAB system, a tape carrier section is connected to a substrate by lead bonding. A problem with this configuration is that an organic film is flexible and cannot uniformly maintain the gap between the tape carrier section and the substrate, deteriorating the solder connection. Another problem is that the solder implementing the connection alone is apt to come off or break and lacks in reliability as to migration. This is because the package is low in heat resistance and humidity resistance and susceptible to mechanical stresses.

SUMMARY OF THE INVENTION

It is therefore an object of the present invention to provide an electronic circuit package assembly insuring reliable connection using solder, and a method of producing the same.

It is another object of the present invention to provide an electronic circuit package assembly capable of reducing mechanical stresses, and a method of producing the same.

It is still another object of the present invention to provide an electronic circuit package assembly having improved reliability as to heat resistance and migration, and a method of producing the same.

It is a further object of the present invention to provide an electronic circuit package assembly allowing a gap between its organic insulating film and a substrate which is stably controlled, and a method of producing the same.

In accordance with the present invention, an electronic circuit package assembly includes an electronic component. A first substrate has a surface on which the electronic component is mounted, and first electrodes electrically connected to the electronic component. A second substrate has second electrodes thereon. A sheet is interposed between the first and second substrates and has connecting portions electrically connecting the first and second electrodes.

Also, in accordance with the present invention, a method of producing an electronic circuit package assembly has the steps of laying a sheet formed of thermosetting resin sheet having solder buried therein on a substrate on which wiring electrodes are formed, mounting to the sheet an organic insulating film carrying an electronic part thereon provided with outer leads, and executing heat treatment for causing the solder to melt and connect the wiring electrodes and outer leads, and for causing the sheet to set.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENT

Figure 1:
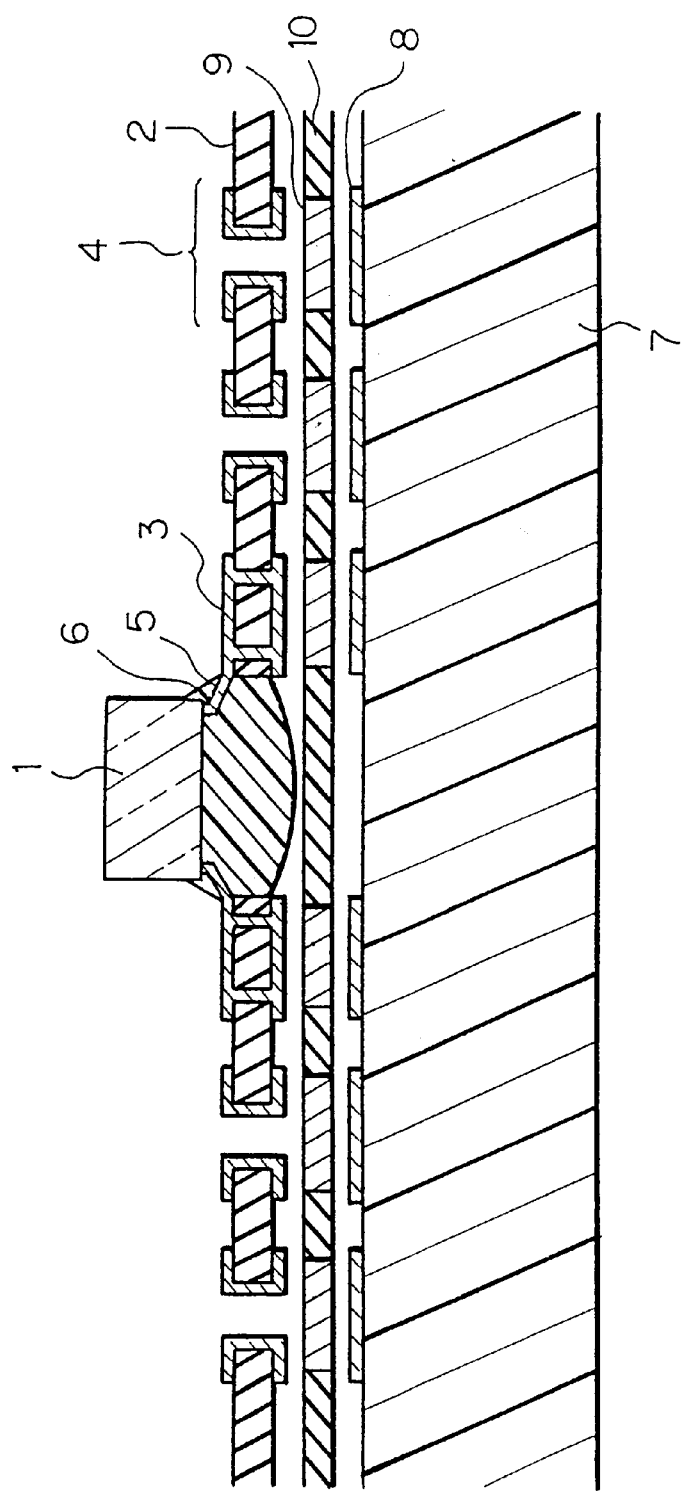
FIG. 1 is a section showing an electronic circuit package assembly embodying the present invention.

Referring to FIG. 1 of the drawings, an electronic circuit package assembly embodying the present invention is shown and includes a printed circuit board or similar substrate 7 and an organic insulating film 2. Wiring electrodes 8 are formed on the substrate 7 and underlie corresponding outer leads 4 provided on the film 2. The electrodes 8 are formed of copper, gold or similar conductor. A wiring pattern 3 is formed on the film 2 and also implemented by copper, gold or similar conductor. Inner leads 5 are electrically connected to the wiring pattern 3. Resin 6 seals the inner leads 5 and a part of an LSI chip 1. The assembly additionally includes a sheet 10 formed of thermosetting resin.

The sheet 10 includes a connection means comprising a conductive element, for example solder (9), in combination with the thermosetting resin. Solder 9 is provided on the sheet 10 beforehand in order to electrically connect the outer leads 4 to the electrodes 8. The LSI chip 1, organic film 2, wiring pattern 3, inner leads 5 and resin 6 constitute a tape carrier section.

Figure 2A:
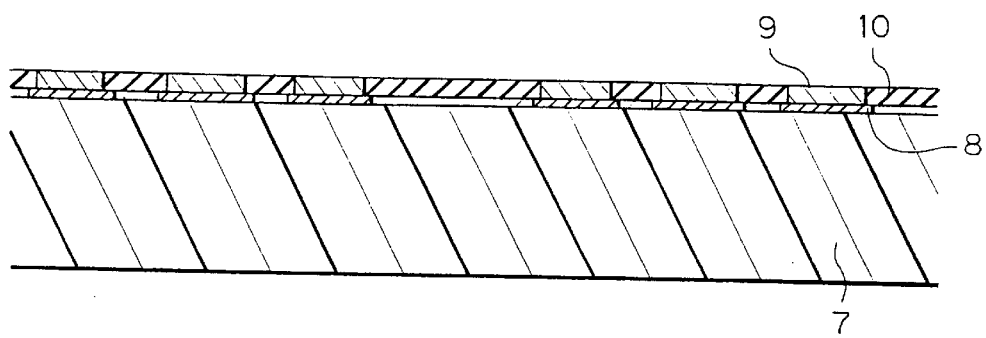
FIGS. 2A–2C are sections showing a sequence of steps for producing the assembly of FIG. 1.

A reference will be made to FIGS. 2A–2C for describing a method of producing the assembly shown in FIG. 1. As shown in FIG. 2A, the sheet 10 formed of thermosetting resin is laid on the substrate 7 carrying the wiring electrodes 8 thereon. The substrate 7 may be formed of a composite material of glass and epoxy resin. The electrodes 8 have gold pads or copper pads thereon. The solder 9 is buried in through-holes formed in the sheet 10. Though-holes are formed in preselected portions so that the solder 9 is positioned opposed to the electrodes 8 on the substrate 7.

Figure 2B:
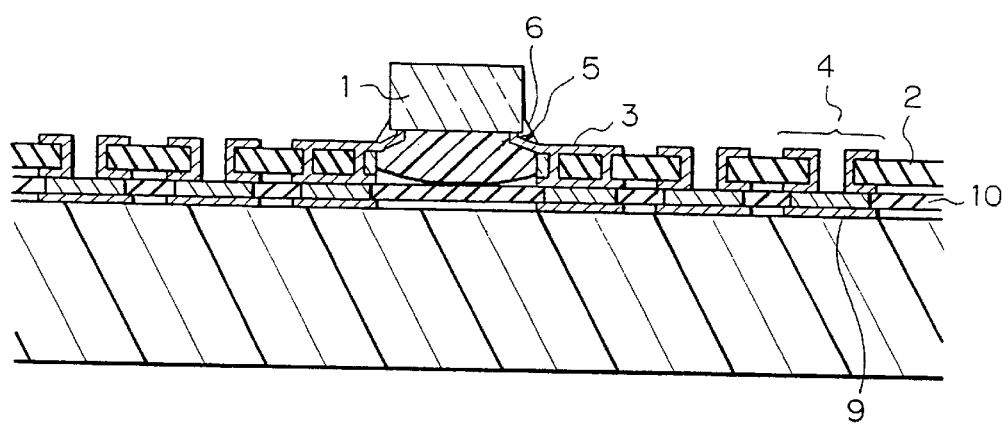

As shown in FIG. 2B, the tape carrier section is mounted to the substrate 7 and sheet 10 shown in FIG. 2A. The LSI chip 1 included in the tape carrier section is sized, e.g., 17.5 mm square. About 800 input/output terminals or pads are formed on the periphery of the chip 1 at a pitch of 80 μm. The requirement for the organic insulating film 2 is that it be resistive to heat, stable in dimension, and closely adhering to a conductor. To meet this requirement, use may be made of a polyimide film, fluorin film, or epoxy film by way of example.

The wiring pattern 3 formed on the film 2 is implemented by copper, by way of example, and about 10 μm to 25 μm thick. The surface of the wiring pattern 3 is plated with, e.g., gold. The wiring pattern 3 plated with gold extends also to the walls of the through-holes of the film 2.

Figure 2C:
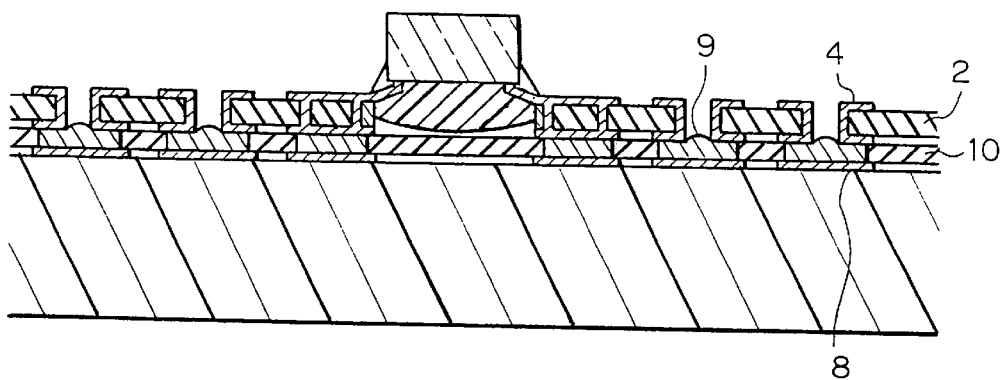

As shown in FIG. 2C, the solder 9 filling the through-holes of the sheet 10 is melted by reflow or similar heat treatment with the result that the external leads 4 and electrodes 8 are connected together. At the same time, the heat treatment causes the sheet 10 to set. The sheet 10 couples the tape carrier section and the substrate 7, and uniformly maintains the gap between the tape carrier section and the substrate 7. The tape carrier section and substrate 7 are caused to closely adhere to each other. In this condition, the outer leads 4 are electrically connected to the electrodes 8.

The thermosetting resin sheet 10 intervening between the tape carrier section and the substrate 7 serves to uniformly maintain the gap between. In addition, because the entire assembly can be fixed in the form of a package, it suffers from a minimum of mechanical stress and achieves high reliability as to humidity resistance and migration.

In summary, in accordance with the present invention, an electronic circuit package assembly includes a tape carrier section and a substrate closely adhering to each other and can be fixed as a package. A connection means comprising, for example, a thermosetting resin sheet with solder, intervenes between the tape carrier section and the substrate. Connection by the solder and the setting of the resin are effected at the same time by reflow or similar heat treatment. This successfully reduces mechanical stresses to act on the assembly and enhances reliability as to humidity resistance and migration. In addition, the sheet between the taper carrier section and the substrate allows the gap between them to be controlled to a preselected value.

Various modifications will become possible for those skilled in the art after receiving the teachings of the present disclosure without departing from the scope thereof.

What is claimed is:

1. An electronic circuit package assembly comprising:

an electronic component;

a first substrate having a surface on which said electronic component is mounted, the first surface having first electrodes electrically connected to said electronic component;

a second substrate having second electrodes on an inner surface thereof;

an interconnecting sheet interposed between said first and second substrates, comprising solder and a bonding element, the interconnecting sheet electrically connecting said first and second electrodes, and bonding the first and second substrates;

wherein said solder is encased in said bonding element of said interconnecting sheet at positions opposed to said second electrodes; and wherein said first substrate comprises a flexible organic film.

2. An assembly as claimed in claim 1, wherein said bonding element is a thermosetting resin.

3. An assembly as claimed in claim 1, wherein said electronic component comprises a semiconductor IC (Integrated Circuit) chip.

4. An electronic circuit package assembly comprising:

an electronic component;

a first substrate having a first surface on which said electronic component is mounted, a plurality of first electrodes electrically connected to said electronic component, a second surface opposite said first surface, and a plurality of through-holes between said first and second surfaces;

said first electrodes further disposed on an interior surface of but not completely filling said through-holes, and portions of said second surface;

a second substrate having a third surface with second electrodes thereon, and said third surface opposing said second surface;

an interconnecting sheet interposed between said second surface of said first substrate and said third surface of said second substrate comprising a conductive element of solder, which provides an electrical connection between said first and second electrodes, and a bonding element, for bonding said first substrate to said second while maintaining a predetermined uniform gap, the conductive element of solder opposing said first electrodes on said second surface and said second electrodes on said third surface, wherein said first substrate comprises a flexible organic film.

5. An assembly as claimed in claim 4, wherein said electronic component comprises a semiconductor IC (Integrated Circuit) chip.

6. An assembly as claimed in claim 4, wherein said conductive element is encased in said interconnecting sheet comprised of thermosetting resin as a bonding element.

7. An electronic circuit package assembly comprising;

An electronic component;

a first substrate of a flexible organic film, having a first surface on which said electronic component is mounted, a plurality of first electrodes electrically connected to said electronic component, a second surface opposite said first surface, and a plurality of through-holes between said first and second surfaces;

said first electrodes further disposed on an interior surface of said through-holes, and portions of said second surface;

a second substrate having a third surface with second electrodes thereon, and said third surface opposing said second surface;

an interconnecting sheet interposed between said second surface of said first substrate and said third surface of said second substrate comprising solder, for providing an electrical connection between said first and second electrodes, and a thermosetting resin, encasing said solder, for bonding said first substrate to said second while maintaining a predetermined uniform gap.

8. An assembly as claimed in claim 7, wherein said conductive element is disposed at positions opposed to said first and second electrodes.

* * * * *

UNITED STATES PATENT AND TRADEMARK OFFICE
CERTIFICATE OF CORRECTION

PATENT NO. : 6,410,860 B2
DATED : June 25, 2002
INVENTOR(S) : Koetsu Tamura

It is certified that error appears in the above-identified patent and that said Letters Patent is hereby corrected as shown below:

<u>Title page,</u>
Item [30], Foreign Application Priority Data, please delete "6-" from Priority Data

Signed and Sealed this

Twenty-second Day of October, 2002

Attest:

JAMES E. ROGAN
Attesting Officer
Director of the United States Patent and Trademark Office